(12) United States Patent
Reusch

(10) Patent No.: US 9,412,971 B2
(45) Date of Patent: Aug. 9, 2016

(54) ENCAPSULATION STRUCTURE FOR AN OPTOELECTRONIC COMPONENT AND METHOD FOR ENCAPSULATING AN OPTOELECTRONIC COMPONENT

(75) Inventor: Thilo Reusch, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 135 days.

(21) Appl. No.: 14/232,632

(22) PCT Filed: Jul. 5, 2012

(86) PCT No.: PCT/EP2012/063127
§ 371 (c)(1),
(2), (4) Date: Jan. 14, 2014

(87) PCT Pub. No.: WO2013/007592
PCT Pub. Date: Jan. 17, 2013

(65) Prior Publication Data
US 2014/0210112 A1    Jul. 31, 2014

(30) Foreign Application Priority Data
Jul. 14, 2011   (DE) .......................... 10 2011 079 129

(51) Int. Cl.
H01L 51/52    (2006.01)
H05B 33/04    (2006.01)
H01L 51/44    (2006.01)

(52) U.S. Cl.
CPC .......... *H01L 51/5256* (2013.01); *H01L 51/448* (2013.01); *H01L 51/5253* (2013.01); *H05B 33/04* (2013.01)

(58) Field of Classification Search
CPC ............ H01L 51/5253; H01L 51/5256; H01L 51/448; H01L 51/52; H01L 51/44; H05B 33/04
See application file for complete search history.

(56) References Cited

U.S. PATENT DOCUMENTS

| 6,423,907 B1 * | 7/2002 | Haba ....................... H01L 23/32 174/261 |
| 6,592,969 B1 | 7/2003 | Burroughes et al. |

(Continued)

FOREIGN PATENT DOCUMENTS

| CN | 1732714 A | 2/2006 |
| DE | 102008019900 A1 | 8/2009 |

(Continued)

OTHER PUBLICATIONS

English language abstract of DE 102008019900 A1 of Aug. 6, 2009.
(Continued)

*Primary Examiner* — Roy Potter
(74) *Attorney, Agent, or Firm* — Viering, Jentschura & Partner mbB

(57) ABSTRACT

An encapsulation structure for an optoelectronic component may include: a barrier thin-film layer for protecting an optoelectronic component against chemical impurities; a cover layer applied above the barrier thin-film layer and serving for protecting the barrier thin-film layer against mechanical damage; and an intermediate layer applied on the barrier thin-film layer between barrier thin-film layer and cover layer and including a curable material designed such that when the non-cured intermediate layer is applied to the barrier thin-film layer, particle impurities at the surface of the barrier thin-film layer are enclosed by the intermediate layer and the applied intermediate layer has a substantially planar surface, and that after the intermediate layer has been cured, mechanical loads on the barrier thin-film layer as a result of particle impurities during the application of the cover layer are reduced by the intermediate layer.

17 Claims, 5 Drawing Sheets

(56) References Cited

U.S. PATENT DOCUMENTS

| | | | |
|---|---|---|---|
| 6,765,351 B2* | 7/2004 | Forrest et al. | 313/506 |
| 7,256,543 B2* | 8/2007 | Su et al. | 313/512 |
| 2003/0110630 A1* | 6/2003 | Onishi et al. | 29/856 |
| 2003/0117066 A1* | 6/2003 | Silvernail | 313/504 |
| 2003/0205845 A1 | 11/2003 | Pichler et al. | |
| 2004/0033375 A1 | 2/2004 | Mori | |
| 2004/0245541 A1* | 12/2004 | Shitagaki | H01L 51/5237 257/103 |
| 2008/0169758 A1 | 7/2008 | Cok | |
| 2012/0132953 A1 | 5/2012 | Becker et al. | |

FOREIGN PATENT DOCUMENTS

| | | |
|---|---|---|
| DE | 102008031405 A1 | 1/2010 |
| DE | 102008048472 A1 | 3/2010 |
| WO | 2010108894 A1 | 9/2010 |

OTHER PUBLICATIONS

English language abstract of DE 102008031405 A1 of Jan. 7, 2010.
English language abstract of DE 102008048472 A1 of Mar. 25, 2010.
International Search Report issued in the corresponding PCT application No. PCT/EP2012/063127, dated Nov. 11, 2012, 2 pages.
International Preliminary Report on Patentability issued in the corresponding PCT application No. PCT/EP2012/063127, dated Jan. 14, 2014, 15 pages.
Chinese Office Action based on application No. 2012800349897 (9 pages + 5 pages English Translation) dated Jul. 2, 2015.

* cited by examiner

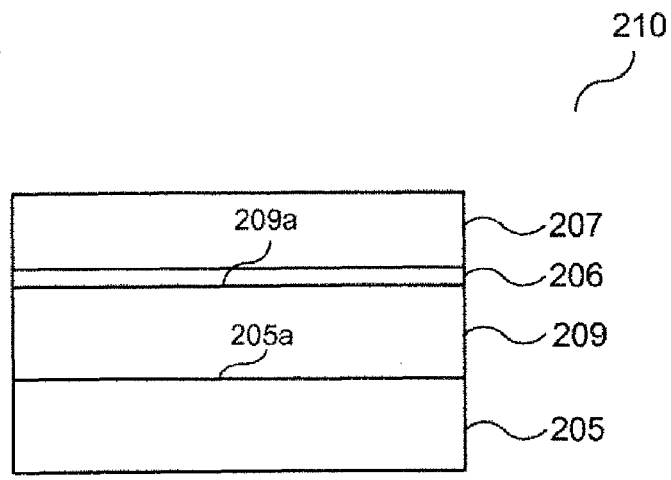
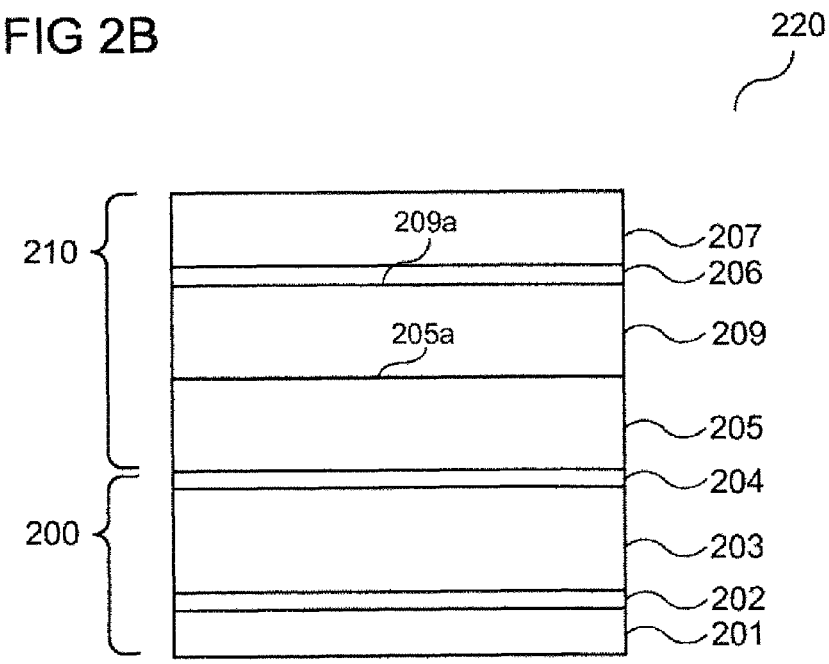

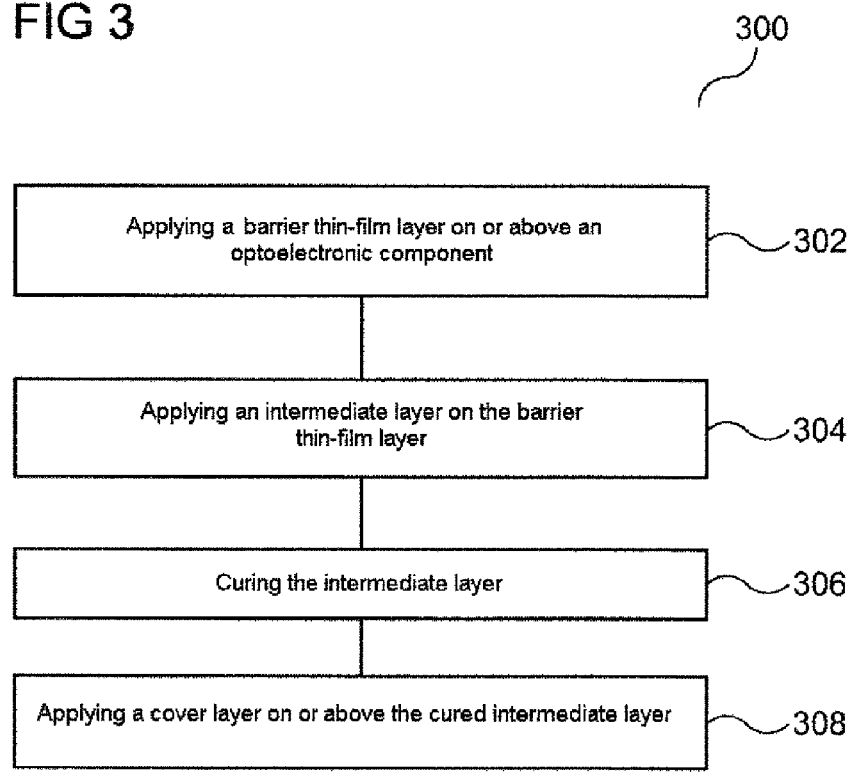

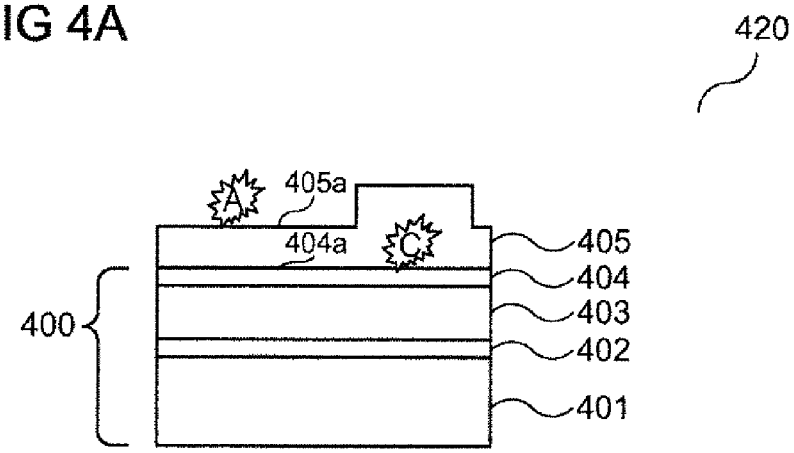
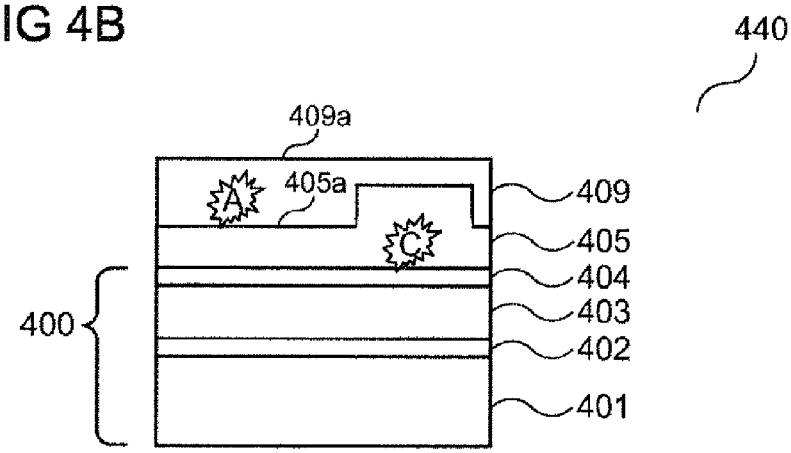

ENCAPSULATION STRUCTURE FOR AN OPTOELECTRONIC COMPONENT AND METHOD FOR ENCAPSULATING AN OPTOELECTRONIC COMPONENT

RELATED APPLICATIONS

The present application is a national stage entry according to 35 U.S.C. §371 of PCT application No. PCT/EP2012/063127 filed on Jul. 5, 2012, which claims priority from German application No. 10 2011 079 129.9 filed on Jul. 14, 2011, and is incorporated herein by reference in its entirety.

TECHNICAL FIELD

Various embodiments relate to an encapsulation structure for an optoelectronic component and to a method for encapsulating an optoelectronic component.

BACKGROUND

Organic optoelectronic components such as, for example, organic light emitting diodes (OLEDs), OLED displays or organic solar cells or photovoltaic cells (organic photovoltaic (OPV) cells) can be protected both against ingress of water and oxygen (encapsulation) and against mechanical contact and damage by the application of protective layers and packaging.

There are various methods for the encapsulation and mechanical packaging of organic optoelectronic components (e.g. OLEDs) on glass substrates.

One method is based on encapsulation with the aid of glass cavities. In this technique, a glass cover is adhesively bonded onto the component (device) with a specific adhesive. This technique can largely prevent the ingress of harmful influences. However, in the region of the adhesive bond, water and oxygen can still diffuse into the component. As a countermeasure in this respect, water- and oxygen-binding materials (so-called getters) can be introduced into the cavity. These can absorb the water and oxygen before the organic materials are damaged. The glass cover simultaneously affords sufficient mechanical protection. However, the method of cavity encapsulation overall is very cost-intensive. Moreover, the use of (rigid) glass covers or glass cavities is not suitable for the manufacture of flexible (i.e. pliable) components (e.g. flexible OLEDs).

In accordance with another method, provision is made for sealing organic components (e.g. OLEDs) exclusively by applying thin films (thin layers or thin-film layers) against water and oxygen (so-called thin-film encapsulation). However, said thin-film layers are generally mechanically very sensitive and should (just like the components itself) be protected against contact or scratching. This can be realized for example by areal lamination of a flat cover glass. Sufficient mechanical protection of the component and the encapsulation can be achieved by the glass. In this case, however, defects still occur relatively frequently, said defects being attributable to particles on the topmost layer of the thin-film encapsulation or on or in the lamination adhesive layer.

The encapsulation by means of thin-film methods is also suitable for flexible components (e.g. flexible OLEDs) on foil substrates (e.g. steel foil or polymer foil substrates). For protection against contact and damage, here for example foils can be laminated onto the substrate foil or the substrate foil can be laminated between two packaging foils. In this case as well, however, damage to the barrier thin-film layer can occur as a result of particle loading at the interface between thin-film layer/adhesive surface.

The patent application DE 10 2008 019 900 A1 presents materials and embodiments for a mechanical protective layer on the barrier layers. Said application for example also describes a lacquer spraying method as a suitable method. In that case, however, only a single-stage process without intermediate layers is described, which does not take account of the problem of particle influence on the encapsulation quality.

FIG. 1A and FIG. 1B schematically illustrate the occurrence of failures as a result of possible particle loading during the lamination and adhesive bonding of protective glasses or foils onto an organic light emitting diode (OLED) in accordance with one conventional method.

FIG. 1A shows in a first view 120 the schematic construction of an organic light emitting diode (OLED) 100 including a substrate 101, a first substrate-side electrode 102 (first electrical contact or bottom contact), organic functional layers 103 and a second top-side electrode 104 (second electrical contact or top contact). For encapsulation against the ingress of water and oxygen, a barrier thin film 105 is applied on the second electrode 104. As mechanical protection, a cover plate 107 (scratch protection film) is applied at the top side and adhesively bonded to the OLED 100 (or the barrier thin film 105) by means of an adhesive layer 106 (adhesive). The adhesive-bonding process or lamination process is symbolized by the arrows 108 in FIG. 1A.

"A" to "D" in FIG. 1A denote typical classes of particle impurity (particle contamination) which can lead to damage to the OLED 100 or the barrier thin film 105: particles can lie on the barrier thin film 105 (particle "A") or on the adhesive layer 106 (particle "B"), or they can be embedded in and below the barrier thin film 105 (particle "C") or the adhesive layer 106 (particle "D").

FIG. 1B shows in a second view 140 the OLED 100 after the cover plate 107 has been applied and adhesively bonded. The adhesive-bonding process or lamination process 108 for applying and adhesively bonding the cover plate 107 on the optoelectronic component 100 is usually effected by exerting mechanical force or pressure on the components to be connected. FIG. 1B shows that the particles (particles "A") situated on the barrier thin film 105 and the particles (particles "B" in FIG. 1B) situated on the adhesive layer 106 are pressed into the barrier thin film 105 by the adhesive-bonding process or lamination process 108. It is furthermore shown that particles (particles "D") embedded in the adhesive layer 106 can also be at least partly pressed into the barrier thin film 105 during the adhesive-bonding process 108. Furthermore, particles (particles "C") embedded in the barrier thin film 105 may also be pressed, by the pressure which is exerted during the adhesive-bonding process 108 and which may be transmitted via the barrier thin film 105 to the particles (particles "C") embedded therein, further into the barrier thin film 105 and possibly as far as the underlying layer (i.e. the second electrode 104 in the embodiment shown), or can even be pressed into the latter, which is shown in FIG. 1B.

Illustratively, during the lamination of the cover layer 107, on account of the small size and thus small bearing area of the deposited or embedded particles, greatly localized peaks of the pressure distribution may occur at the particles (in particular at the underside of the particles) since the pressure is inversely proportional to the bearing area. These local pressure peaks may in turn lead to a greatly localized mechanical loading on the layers adjoining the particles (in particular the underlying layers). Consequently, the particles may damage the barrier thin film 105 and possibly also one or more of the underlying layers (e.g. the second electrode 104, the functional layers 103 and possibly even deeper layers) as a result of the greatly localized mechanical loading.

In particular as a result of the mechanical damage to the barrier thin film 105, further damage to the OLED 100 (in particular the organic functional layers 103) may occur as a result of ingress of harmful chemical constituents such as e.g. water or oxygen into the OLED 100. This may lead to impairment of the function or even to the total failure of the OLED 100.

The effects during encapsulation and packaging as described above with reference to FIG. 1A and FIG. 1B using the example of an organic light emitting diode (OLED) can also occur in the case of other optoelectronic components, in particular other organic optoelectronic components, which are encapsulated and packaged in the same or a similar manner.

SUMMARY

In various embodiments, provision is made of a particle-tolerant encapsulation and protective coating for optoelectronic components, for example organic optoelectronic components such as e.g. OLEDs.

In various embodiments, provision is made of an encapsulation structure for optoelectronic components, for example organic optoelectronic components such as e.g. OLEDs, in which damage to the optoelectronic component or optoelectronic components as a result of particle impurities is avoided.

In various embodiments, provision is made of a particle-tolerant multistage method for applying protective films on an optoelectronic component, for example an organic optoelectronic component such as e.g. an OLED.

In various embodiments, an encapsulation structure for an optoelectronic component includes a barrier thin-film layer (also designated as barrier thin film) for protecting an optoelectronic component against chemical impurities, a cover layer applied above the barrier thin-film layer and serving for protecting the barrier thin-film layer against mechanical damage, and an intermediate layer applied on the barrier thin-film layer between barrier thin-film layer and cover layer. The intermediate layer includes a curable material designed such that when the non-cured intermediate layer is applied to the barrier thin-film layer, particle impurities at the surface of the barrier thin-film layer are enclosed by the intermediate layer and the applied intermediate layer has a substantially planar surface, and that after the intermediate layer has been cured, mechanical loads on the barrier thin-film layer as a result of particle impurities during the application of the cover layer are reduced by the intermediate layer.

In other words, the intermediate layer, after curing, may have a hardness such that mechanical loads on the barrier thin-film layer that are caused as a result of particle impurities during the application of the cover layer are reduced by means of the intermediate layer.

In various embodiments, a method for encapsulating an optoelectronic component includes: applying a barrier thin-film layer on or above an optoelectronic component for protecting the optoelectronic component against chemical impurities; applying an intermediate layer on the barrier thin-film layer, wherein the intermediate layer includes a curable material designed such that when the non-cured intermediate layer is applied to the barrier thin-film layer, particle impurities at the surface of the barrier thin-film layer are enclosed by the intermediate layer and the applied intermediate layer has a substantially planar surface; curing the intermediate layer; and applying a cover layer on or above the cured intermediate layer for protecting the barrier thin-film layer against mechanical damage, wherein the curable material of the intermediate layer is designed such that after the intermediate layer has been cured, said intermediate layer has a hardness such that mechanical loads on the barrier thin-film layer that are caused as a result of particle impurities during the application of the cover layer are reduced by means of the intermediate layer.

In various embodiments, an encapsulation arrangement includes an optoelectronic component and an encapsulation structure. The optoelectronic component includes at least one functional layer. The encapsulation structure is formed above the at least one functional layer. The encapsulation structure can be formed in accordance with one or more of the configurations described herein.

The various configurations of the embodiments apply in an identical way, insofar as expedient, both to the encapsulation structure for an optoelectronic component and to the encapsulation arrangement and the method for encapsulating an optoelectronic component.

The term "layer" or "layer structure", as used herein, can denote an individual layer or a layer sequence (layer stack) composed of a plurality of thin (partial) layers. In particular, functional layers, for example organic functional layers, of the optoelectronic component can be formed from a plurality of (partial) layers. However, other layers described herein can also be formed from a plurality of (partial) layers.

The terms "arranged one on top of another", "formed one on top of another" and "applied on a layer", as used herein, mean, for example, that one layer is arranged directly in direct mechanical and/or electrical contact on another layer. One layer can also be arranged indirectly on another layer, in which case further layers can then be present between the layers indicated. Such layers can serve, for example, to further improve the functionality and thus the efficiency of the optoelectronic component.

The terms "arranged one above another", "formed one above another" and "applied above a layer", as used herein, mean, for example, that one layer is arranged at least indirectly on another layer. That is to say that further layers can be present between the layers indicated.

In the context of this application, "impurities" and "contaminations" can generally be understood to mean materials, material compounds, particles, substances, etc. whose occurrence during a manufacturing process or whose presence in a processed component (device) is undesirable since they can, for example, adversely influence the manufacturing process and/or impair the functionality of the component.

In the context of this application, "chemical impurities" and "chemical contaminations" can be understood to mean chemical constituents from the environment which act as impurities during the production of an optoelectronic component (e.g. an organic optoelectronic component). By way of example, "chemical impurities" can be understood to mean chemical constituents of the environment which, if they come into contact with one or a plurality of layers of an optoelectronic component (in particular with one or a plurality of functional layers of the optoelectronic functional layers (e.g. organic functional layers in the case of an organic optoelectronic component such as e.g. an OLED)), can react with this or these layer(s) and can thereby impair or damage the functionality of the layer(s) and thus of the optoelectronic component. Examples of such harmful constituents are, in particular, water (moisture) or oxygen. The chemical contaminations even as traces or as individual molecules can have a damaging effect. They can reach the OLED layers for example by adsorption or condensation or wetting. They can furthermore pass into the component and into further layers by diffusion at surfaces or interfaces in the component, or by diffusion through the layers.

In the context of this application, a "barrier thin-film layer" and a "barrier thin film" can be understood to mean, for example, a layer or a layer structure which is suitable for forming a barrier against chemical impurities or atmospheric substances, in particular against water (moisture) and oxygen. In other words, the barrier thin-film layer is formed in such a way that atmospheric substances such as water or oxygen cannot penetrate through said barrier thin-film layer or at most very small proportions of said substances can penetrate through said barrier thin-film layer.

Suitable configurations of the barrier thin-film layer can be found for example in the patent applications DE 10 2009 014 543, DE 10 2008 031 405, DE 10 2008 048 472 and DE 2008 019 900.

In accordance with one configuration, the barrier thin-film layer can be formed as an individual layer (to put it another way, as a single layer).

In accordance with an alternative configuration, the barrier thin-film layer may include a plurality of partial layers formed one on top of another. In other words, in accordance with one configuration, the barrier thin-film layer can be formed as a layer stack.

The barrier thin-film layer or one or a plurality of partial layers of the barrier thin-film layer can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer having a plurality of partial layers, all the partial layers can be formed by means of an atomic layer deposition method. A layer sequence including only ALD layers can also be designated as a "nanolaminate".

In accordance with an alternative configuration, in the case of a barrier thin-film layer including a plurality of partial layers, one or a plurality of partial layers of the barrier thin-film layer can be deposited by means of a different deposition method than an atomic layer deposition method, for example by means of a vapor deposition method.

In accordance with one configuration, the barrier thin-film layer can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer includes a plurality of partial layers, all the partial layers can have the same layer thickness. In accordance with another configuration, the individual partial layers of the barrier thin-film layer can have different layer thicknesses. In other words, at least one of the partial layers can have a different layer thickness than one or more other partial layers.

The barrier thin-film layer or the individual partial layers of the barrier thin-film layer can be formed as a transparent layer in accordance with one configuration. In other words, the barrier thin-film layer (or the individual partial layers of the barrier thin-film layer) can consist of a transparent material (or a material combination that is transparent). In this context, a transparent or translucent material can be understood to mean, for example, a material that is transparent or transmissive to light in the visible wavelength range.

By way of example, in various configurations in which the optoelectronic component is embodied as a top emitter (or as a combination of top emitter and bottom emitter), the barrier thin-film layer or the individual partial layers of the barrier thin-film layer can be formed as transparent layer(s).

In accordance with one configuration, the barrier thin-film layer or the individual partial layers of the barrier thin-film layer can be formed as non-transparent layer(s).

In accordance with one configuration, the barrier thin-film layer or (in the case of a layer stack having a plurality of partial layers) one or a plurality of the partial layers of the barrier thin-film layer may include or consist of one of the following materials: aluminum oxide, zinc oxide, zirconium oxide, titanium oxide, tantalum oxide, hafnium oxide, lanthanum oxide, silicon oxide, silicon nitride, silicon oxynitride, indium tin oxide, indium zinc oxide, aluminum-doped zinc oxide, and mixtures and alloys thereof.

In accordance with one configuration, in the case of a barrier thin-film layer including a plurality of partial layers, all the partial layers may include or consist of the same material. In accordance with another configuration, the individual partial layers of the barrier thin-film layer may include or consist of different materials. In other words, at least one of the partial layers may include or consist of a different material than one or more other partial layers.

In the context of this application, "particle impurities" and "particle contaminations" can be understood to mean, for example, impurities as a result of microscopic solid particles, in other words impurities as a result of solid particles having dimensions (e.g. diameter) in the nanometers to micrometers range, e.g. dust particles having dimensions in the micrometers range, e.g. particles having a diameter in the range of approximately 0.01 μm to approximately 100 μm, for example in the range of approximately 1 μm to approximately 10 μm. Such particle impurities can occur, for example, owing to the fact that it is not always possible to ensure one hundred percent purity in the process chamber (e.g. reactor) during a component manufacturing process. Undesirable particle contamination can occur, for example, if, during the production of a layer structure having a plurality of layers, there is a relatively long period of time between the process for depositing a first layer and the process for depositing the subsequent layer. In this case, it is possible, in the time between the two deposition processes, for particles to deposit on the surface of the first deposited layer and "contaminate" the latter. Furthermore, particle contamination can for example also occur if, during a component manufacturing process, the component is transferred from one process chamber into another.

In accordance with various embodiments, an intermediate layer applied on a barrier thin-film layer, by virtue of properties such as interfacial tension, layer thickness and viscosity, ensures good inclusion of particles or particle impurities present at or on the surface of the barrier thin-film layer and a planarizing covering of the surface. In other words, by means of the intermediate layer, firstly particle impurities situated at the surface of the barrier thin-film layer can be included or enclosed, and secondly unevennesses at the surface which can be brought about by particle impurities can be compensated for.

In accordance with various embodiments, the intermediate layer includes a curable material. In the context of this application, a "curable material" can be understood to mean, for example, a material which can undergo transition or be transferred from a first state having lower mechanical hardness or strength (non-cured state) to a second state having, compared with the first state, higher mechanical hardness or strength (cured state). The transition from the first (non-cured) state to the second (cured) state can be designated as "curing".

In accordance with one configuration, the curable material of the intermediate layer is formed as thermally curing material. In other words, the curable material can cure or be cured by means of a thermal treatment (in other words, by means of a heat treatment or heating).

In accordance with various configurations, the curable material can be a thermally curable material which cures at a temperature of less than approximately 120° C.

The temperature used for curing can be for example approximately 30° C. to approximately 120° C. in accordance with one configuration, for example approximately 60° C. to approximately 100° C. in accordance with one configuration, for example approximately 80° C. in accordance with one configuration.

The duration of the thermal treatment can be for example approximately 10 seconds to approximately 10 hours in accordance with one configuration, for example approximately 1 minute to approximately 3 hours in accordance with one configuration, for example approximately 2 hours in accordance with one configuration.

One advantage of a thermally curable material that cures at a relatively low temperature and/or already after a relatively short heat treatment duration can be seen in the fact that damage to the optoelectronic component as a result of excessively high temperatures and/or excessively long heat treatment times can be avoided. In general, this requirement limits the maximum temperature to less than 120° C. Furthermore, a low thermal budget can entail a cost saving.

In accordance with one configuration, the curable material of the intermediate layer is formed as UV-curing material. In other words, the curable material can cure or be cured by means of the action of UV radiation (ultraviolet radiation). The UV radiation used for curing can have for example a wavelength in the range of approximately 200 nm to approximately 450 nm in accordance with one configuration, for example in the range of approximately 300 nm to approximately 410 nm in accordance with one configuration, for example approximately 350 nm. Furthermore, the UV radiation used can have a dose that is less than approximately 10 000 mJ/cm$^2$ in accordance with one configuration, e.g. a dose in the range of approximately 100 mJ/cm$^2$ to approximately 10 000 mJ/cm$^2$ in accordance with one configuration, e.g. a dose in the range of approximately 200 mJ/cm$^2$ to approximately 6000 mJ/cm$^2$ in accordance with one configuration, e.g. a dose of approximately 1000 mJ/cm$^2$ in accordance with one configuration.

The UV-curing material can be chosen for example such that the parameters of the UV radiation (e.g. wavelength, dose) that are used for curing can be chosen such that possible damage to the optoelectronic component as a result of the UV radiation can be avoided. This restricts the UV dose generally to less than 10 000 mJ/cm$^2$.

In accordance with one configuration, the curable material of the intermediate layer is formed as self-curing material. In this context, a "self-curing material" can be understood to mean for example a material that cures without external action (e.g. heat treatment or UV irradiation) under normal room conditions (temperature, air humidity, pressure), e.g. after a specific (for example material-dependent) time duration has elapsed.

One advantage of a self-curing material can be seen in the fact that curing the material does not require for example an apparatus for heat treatment (heating) or for UV irradiation. Costs can thus be saved. Self-curing can be achieved for example by mixing the lacquer with an additional curing agent directly before application (two-component lacquer).

In accordance with one configuration, the curable material of the intermediate layer is formed as a flexible (in other words pliable) material.

In accordance with one configuration, the curable material of the intermediate layer is formed as transparent material.

In accordance with one configuration, the curable material of the intermediate layer is formed as a UV-resistant material. In this context, a UV-resistant material can be understood to mean a material which, in the cured state, no longer changes its properties, or changes them only insignificantly, under the action of UV radiation.

In this case, the intermediate layer may include for instance plastics such as, for instance, siloxanes, epoxides, acrylates such as, for example, methyl methacrylates, imides, carbonates, olefins, styrenes, urethanes or derivatives thereof in the form of monomers, oligomers or polymers and furthermore also mixtures, copolymers or compounds including them. By way of example, the intermediate layer may include or be an epoxy resin, polymethyl methacrylate (PMMA), polystyrene, polyester, polycarbonate, polyacrylate, polyurethane or a silicone resin such as, for instance, polysiloxane or mixtures thereof.

In accordance with one configuration, the curable material of the intermediate layer includes a lacquer material. The curable material can be formed as curable lacquer material or as curable lacquer.

The intermediate layer may furthermore include a spray lacquer or be formed as a spray lacquer which includes at least one of the abovementioned materials and which can be applied for example by means of a continuous spray lacquering installation. The spray lacquer may furthermore be a UV-curable and/or a binder- or solvent-containing spray lacquer.

In accordance with various configurations, the curable lacquer material may be a UV-curable and/or transparent and/or flexible and/or UV-resistant lacquer material. In other words, the lacquer material may be a material which has an arbitrary selection or combination of the abovementioned properties.

In accordance with one configuration, the hardness of the intermediate layer after curing (measured according to Shore D) may be greater than 70 and preferably greater than 85.

In accordance with one configuration, the layer thickness of the intermediate layer is greater than or approximately equal to the average particle diameter of the particle impurities.

The layer thickness of the intermediate layer may be chosen such that the particle impurities (to put it another way, particle contaminations) or particles present at the surface or on the surface of the barrier thin-film layer are reliably included (in other words, enclosed) by the intermediate layer. In other words, the layer thickness of the intermediate layer may be chosen such that particle impurities present at or on the surface of the barrier thin-film layer are completely surrounded or enclosed by the material of the intermediate layer and, in particular, illustratively do not "project" from said intermediate layer.

In accordance with one configuration, the layer thickness of the intermediate layer is for example approximately 100 nm to approximately 100 µm, for example approximately 200 nm to approximately 50 µm in accordance with one configuration, for example 500 nm to approximately 20 µm in accordance with one configuration, for example approximately 1 µm to approximately 10 µm in accordance with one configuration.

In accordance with one configuration, the material of the intermediate layer can be coordinated with the material of the barrier thin-film layer. In other words, the material of the intermediate layer can be adapted to the material of the barrier thin-film layer. To put in yet another way, specific physical properties of the material of the intermediate layer and of the material of the barrier thin-film layer can be coordinated with one another. By way of example, the material of the intermediate layer may have a coefficient of thermal expansion the same as or similar to that of the material of the barrier thin-film layer. This makes it possible to avoid a situation for example where, during the curing of the intermediate layer by means of heating (heat treatment), on account of different coefficients of thermal expansion of intermediate layer and barrier thin-film layer, strains and, as a result, possibly cracks occur in one or both layers. Furthermore, the material of the intermediate layer should not cause stresses, or should cause them only to a small extent, in the underlying layers.

In accordance with various configurations, the intermediate layer may be applied on the barrier thin-film layer by means of a contactless application method. In this context, a contactless application method may be understood to mean, for example, a method in which the layer is applied without using external pressure. In other words, no external pressure or pressing is required for applying the layer, in contrast to a lamination method, for example. In this case, the non-cured material of the intermediate layer is applied to the barrier layer in liquid form, in droplet form or from the gas phase and is distributed uniformly.

By way of example, one (or more) of the following methods may be used as the contactless application method: a spraying method, a spin coating method (to put it another way, a rotary coating method or spin-on method), a dip coating method, a slot die coating method, a doctor blading method. Alternatively, other suitable contactless application methods can be used.

The (contactless) processes or methods for applying the intermediate layer avoid mechanical loading of the surface of the barrier thin-film layer or of the optoelectronic component (e.g. an organic optoelectronic component such as e.g. an OLED).

Directly before the application process, a contactless cleaning step can be introduced, which further reduces the loading as a result of particles on the barrier layer. Examples of contactless cleaning methods are dipping or rinsing or spray cleaning with cleaning liquids, electrostatic methods or plasma methods, and blasting away (e.g. using air knife, spray gun).

Applying the intermediate layer by means of spin coating can be particularly suitable for including residual particles and planarizing the surface.

In accordance with one configuration, a polyacrylic protective lacquer can be applied by spin coating as an intermediate layer.

Directly before the intermediate layer (e.g. the lacquer) is applied by spin coating, the plate (the rotary plate) can be blasted using an inert gas (for example nitrogen). This can serve, for example, to reduce the number of possible particle impurities on the surface of the barrier thin-film layer. In other words, the particle loading can be further reduced.

In accordance with various configurations, the intermediate layer is applied to the barrier thin-film layer in a non-cured state. In this case, the (as yet) non-cured intermediate layer ensures, by virtue of properties such as interfacial tension or wetting capability, layer thickness and viscosity, a good inclusion of the particles and a planarizing covering of the surface.

In accordance with various configurations, the intermediate layer is cured after the intermediate layer has been applied. The intermediate layer can be cured for example by means of irradiation with UV light (with the use of a UV-curing material for the intermediate layer). Alternatively, the intermediate layer can be cured by means of heat treatment (heating) with a predefinable temperature (with the use of a thermally curing material for the intermediate layer). However, the curing can also be effected without external influence such as e.g. UV radiation or heat treatment, e.g. if a self-curing material is used for the intermediate layer. In this case, the intermediate layer can illustratively be cured "automatically" after a specific time duration (e.g. dependent on the material of the intermediate layer) has elapsed.

In accordance with various configurations, the curing of the intermediate layer (e.g. by irradiation with UV light or by heat treatment) can be effected temporally directly after the application of the intermediate layer. In this context, the expression "temporally directly after" can be understood to mean that the curing of the intermediate layer is effected temporally directly after the application of the barrier thin-film layer, e.g. without transport of the OLEDs or no later than one day after the application of the barrier thin-film layer.

By virtue of the fact that the intermediate layer is cured directly after application, the loading as a result of particles can be further reduced. Illustratively, by virtue of the fact that the time interval between application and curing of the intermediate layer is shortened or minimized, it is possible to wholly or partly prevent (further) particle impurities from occurring or depositing on the layer structure of the optoelectronic component. Furthermore, the duration of the process for encapsulating the optoelectronic component can be shortened.

After the intermediate layer has been cured, it is robust enough to absorb mechanical loads at the included particles. Typically, the optoelectronic component (e.g. organic optoelectronic component such as e.g. OLED) is contact-resistant after the intermediate layer has been applied. In other words, the optoelectronic component is protected against normal contact after the intermediate layer has been cured.

In accordance with various configurations, further mechanical protective plates or protective foils can be applied (e.g. by means of a lamination process) to an optoelectronic component (for example an organic optoelectronic component such as e.g. OLED) which has been provided with an intermediate layer described herein. The optoelectronic component (for example organic optoelectronic component such as e.g. OLED) is protected against mechanical loading and particle contamination during the application (e.g. lamination) of the protective plates or protective foils by means of the intermediate layer.

In the context of this application, a "functional layer" of an optoelectronic component can be understood to mean a layer which serves for charge transport and for light generation in the optoelectronic component.

In accordance with one configuration, the at least one functional layer of the optoelectronic component is formed as an organic functional layer.

An "organic functional layer" can contain emitter layers, for example including fluorescent and/or phosphorescent emitters.

Examples of emitter materials which can be used in the optoelectronic component in accordance with various configurations include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III)), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium (III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of wet-chemical methods such as spin coating, for example.

The emitter materials can be embedded in a matrix material in a suitable manner.

The emitter materials of the emitter layers of the optoelectronic component can be selected for example such that the optoelectronic component emits white light. The emitter layer may include a plurality of emitter materials that emit in different colors (for example blue and yellow or blue, green and red); alternatively, the emitter layer can also be constructed from a plurality of partial layers, such as a blue fluorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The optoelectronic component can generally include further organic functional layers that serve to further improve the functionality and thus the efficiency of the optoelectronic component.

By way of example, it is possible to select organic functional layers which serve to improve the functionality and the efficiency of the first electrode and/or of the second electrode and of charge carrier and exciton transport.

It should be pointed out that, in alternative embodiments, any suitable form of light emitting functional layers, for example organic functional layers, can be provided and the embodiments are not restricted to a specific type of functional layer(s).

In accordance with one configuration, the optoelectronic component is formed or designed as an organic optoelectronic component. The optoelectronic component can be formed, for example, without being restricted thereto, as an organic light emitting diode (OLED), as an organic solar cell or photovoltaic cell (OPV), as an organic phototransistor or the like.

The optoelectronic component may include a substrate.

A "substrate", as used herein, may include, for example, a substrate usually used for an optoelectronic component. The substrate can be a transparent substrate. However, the substrate can also be a non-transparent substrate. By way of example, the substrate may include glass, quartz, sapphire, plastic foil(s), metal, metal foil(s), silicon wafers or some other suitable substrate material. In various configurations, substrate is understood to mean the layer on which all other layers are subsequently applied during the production of the optoelectronic component. Such subsequent layers can be layers required for the emission of radiation e.g. in the case of an optoelectronic component or a radiation-emitting device.

In accordance with one configuration, the substrate is formed as a rigid substrate. By way of example, the substrate can be formed as a glass substrate.

In accordance with one configuration, the substrate is formed as a flexible (in other words pliable) substrate. By way of example, the substrate can be formed as a foil substrate, e.g. as a steel foil substrate or as a polymer foil substrate in accordance with one configuration.

The substrate can be formed as a transparent substrate (e.g. as a transparent foil in accordance with one configuration), alternatively as a non-transparent substrate (e.g. as a silicon wafer in accordance with one configuration).

In accordance with one configuration, a first electrode (first electrical contact) is formed between the substrate and the at least one functional layer. The first electrode can be applied on or above the substrate, and the at least one functional layer can be applied on or above the first electrode. The first electrode can also be designated as bottom electrode or as bottom contact. Alternatively, the first electrode can also be designated as substrate-side electrode or substrate-side contact.

The first electrode can be an anode, alternatively a cathode.

In accordance with one configuration, a second electrode is formed between the at least one functional layer and the barrier thin-film layer. The second electrode can be applied on or above the at least one functional layer, and the barrier thin-film layer can be applied on or above the second electrode. The second electrode can also be designated as top electrode or as top contact. Alternatively, the second electrode can also be designated as top-side electrode or top-side contact.

The second electrode can be a cathode (e.g. if the first electrode is an anode), alternatively an anode (e.g. if the first electrode is a cathode).

Electrical contact can be made with the first electrode and the second electrode in a suitable manner.

The first electrode and/or the second electrode can be formed in a transparent fashion. Alternatively, the first electrode and/or the second electrode can be formed in a non-transparent fashion.

By way of example, in accordance with one configuration in which the optoelectronic component is embodied as a bottom emitter, the first electrode (bottom electrode) can be formed in a transparent fashion and the second electrode (top electrode) can be formed in a non-transparent fashion. In this case, the second electrode can be formed as a reflective electrode (reflective contact), in other words as an electrode which substantially or completely reflects the radiation emitted by the at least one functional layer.

In accordance with one configuration in which the optoelectronic component is embodied as a top emitter, the second electrode (top electrode) can be formed in a transparent fashion and the first electrode (bottom electrode) can be formed in a non-transparent fashion. In this case, the first electrode can be formed as a reflective electrode (reflective contact), in other words as an electrode which substantially or completely reflects the radiation emitted by the at least one functional layer.

In accordance with one configuration in which the optoelectronic component is embodied as a combination of top emitter and bottom emitter (transparent or translucent OLED), the first electrode and the second electrode can be formed in each case as a transparent electrode.

The first electrode and/or the second electrode can have been or be applied by means of a deposition method, for example. In accordance with one configuration, the first electrode and/or the second electrode can be applied by means of sputtering or by means of thermal evaporation. Alternatively, other suitable methods can be used for applying the first and/or second electrode.

In accordance with various configurations, the first electrode and/or the second electrode can have a layer thickness in a range of approximately 5 nm to approximately 30 nm, for example a layer thickness in a range of approximately 10 nm to approximately 20 nm. In accordance with alternative configurations, the first electrode and/or the second electrode can have a different layer thickness.

The first electrode and/or the second electrode can be formed from a material or include a material which is selected from metals such as aluminum, barium, indium, silver, gold, magnesium, calcium and lithium and combinations thereof or a compound thereof, in particular an alloy, and transparent conductive oxides, such as, for example, metal oxides, such as zinc oxide, tin oxide, cadmium oxide, titanium oxide, indium oxide or indium-doped tin oxide (ITO), aluminum-doped zinc oxide (AZO), $Zn_2SnO_4$, $CdSnO_2$, $ZnSnO_2$, $MgIn_2O_4$, $GaInO_2$, $Zn_2In_2O_5$ or $In_4Sn_3O_{12}$ or mixtures of different transparent conductive oxides. In accordance with other configurations, the first electrode and/or the second electrode may include or consist of some other suitable material.

The cover layer can also be designated as mechanical protective layer or mechanical protective film.

In accordance with one configuration, the cover layer is formed as a rigid layer, e.g. as a glass layer. In this case, the cover layer can also be designated as cover plate.

In accordance with an alternative configuration, the cover layer is formed as a flexible layer (e.g. as a foil).

The cover layer can be formed as a transparent layer, alternatively as a non-transparent layer.

By way of example, in one configuration in which the optoelectronic component is embodied as a top emitter or as a transparent OLED, the cover layer can be formed as a transparent layer.

In accordance with one configuration, the cover layer is laminated on the intermediate layer. The cover layer can be for example a self-adhesive protective foil, e.g. a polycarbonate foil (e.g. having a layer thickness of approximately 300 μm, alternatively having a different layer thickness) with an adhesive layer (adhesive film) (e.g. having a layer thickness of approximately 25 μm, alternatively having a different layer thickness).

In accordance with one configuration, the application of the intermediate layer is effected temporally directly after the application of the barrier thin-film layer. In this context, the expression "temporally directly after" can be understood to mean that the intermediate layer, in the context of the process for encapsulating the optoelectronic component, is applied temporally directly after the barrier thin-film layer, e.g. without a reactor change or no later than one day after the application of the barrier thin-film layer.

The direct application of the intermediate layer after the deposition of the barrier thin-film layer can prevent contamination of the surface of the barrier thin-film layer by particles. In other words, by virtue of the fact that the intermediate layer is applied directly after the application of the barrier thin-film layer, the loading as a result of particles can be further reduced. Illustratively, by virtue of the fact that the time interval between the application of the barrier thin-film layer and the application of the intermediate layer is shortened or minimized, it is possible to wholly or partly prevent (further) particle impurities from occurring or depositing on the surface of the barrier thin-film layer. Furthermore, the duration of the process for encapsulating the optoelectronic component can be shortened.

In accordance with various configurations, the optoelectronic component (e.g. organic optoelectronic component such as e.g. OLED) can be embodied as a "bottom emitter".

The term "bottom emitter" or "bottom emitting optoelectronic component", as used herein, denotes an embodiment which is embodied as transparent toward the substrate side of the optoelectronic component. By way of example, for this purpose at least the substrate and layers formed between the substrate and the at least one functional layer (e.g. an electrode (bottom electrode) formed between substrate and functional layer(s)) can be embodied in a transparent fashion. Accordingly, an optoelectronic component embodied as a bottom emitter can emit radiation generated for example in the functional layers (e.g. organic functional layers in the case of an organic optoelectronic component such as e.g. an OLED) on the substrate side of the optoelectronic component.

As an alternative or in addition thereto, the optoelectronic component can be embodied as a "top emitter" in accordance with various embodiments.

The term "top emitter" or "top emitting optoelectronic component", as used herein, denotes for example an embodiment which is embodied as transparent toward that side (to put it another way, the top side) of the optoelectronic component that faces away from the substrate. In particular, for this purpose the layers formed on or above the at least one functional layer of the optoelectronic component (e.g. electrode (top electrode) formed between functional layer(s) and barrier thin-film layer, barrier thin-film layer, intermediate layer, cover layer) can be embodied in a transparent fashion. Accordingly, an optoelectronic component embodied as a top emitter can emit radiation generated for example in the functional layers (e.g. organic functional layers in the case of an organic optoelectronic component such as e.g. an OLED) on the top side of the optoelectronic component.

An optoelectronic component configured as a top emitter in accordance with various embodiments can advantageously have a high coupling-out of light and a very small angle dependence of the radiance. An optoelectronic component in accordance with various embodiments can advantageously be used for lighting systems, such as room luminaires, for example.

A combination of bottom emitter and top emitter is likewise provided in various embodiments. In one such embodiment, the optoelectronic component is generally able to emit the light generated in the functional layers (e.g. the organic functional layers in the case of an organic optoelectronic component such as e.g. an OLED) in both directions—that is to say both toward the substrate side and toward the top side (transparent or translucent OLED).

In accordance with another embodiment, a third electrode is provided in the optoelectronic component, said third electrode being arranged between the first electrode and the second electrode.

The third electrode can function as an intermediate contact. It can serve to increase charge transport through the layers of the optoelectronic component and thus to improve the efficiency of the optoelectronic component. The third electrode can be configured as an ambipolar layer. It can be configured as cathode or anode.

In the same way as the first electrode and the second electrode, electrical contact can have been or be suitably made with the third electrode in accordance with various embodiments.

In one development of the optoelectronic component, an emitter layer and one or a plurality of further organic functional layers are contained as organic functional layers. The further organic functional layers can be selected from the group consisting of hole injection layers, hole transport layers, hole blocking layers, electron injection layers, electron transport layers and electron blocking layers.

Suitable functional layers and suitable organic functional layers are known per se to the person skilled in the art. The (organic) functional layers can preferably be applied by means of thermal evaporation. The further (organic) functional layers can advantageously improve the functionality and/or efficiency of the optoelectronic component.

In accordance with various configurations, a three-stage process for encapsulating an optoelectronic component is provided, which process includes: (1) applying a thin-film barrier film (barrier thin-film layer) as protection against ingress of harmful chemical constituents from the environment (e.g. water or oxygen) into the optoelectronic component, (2) applying a protective and buffer layer (intermediate layer) on the thin film (e.g. directly on the thin film). In this case, it is possible to use materials and processes which minimize the particle loading on the surface or make particles harmless by enclosure. This layer forms the basis for (3) applying a mechanical protective layer (cover layer).

In accordance with various configurations, methods known per se can be used for steps (1) and (3). One aspect of various configurations consists in the introduction of the additional step (2) with suitable methods and materials and the suitable combination with the other process steps.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 2A shows an encapsulation structure for an optoelectronic component in accordance with one embodiment;

FIG. 2B shows an encapsulation arrangement in accordance with one embodiment;

FIG. 3 shows a method for encapsulating an optoelectronic component in accordance with one embodiment;

FIGS. 4A to 4D show a method for encapsulating an optoelectronic component in accordance with one embodiment.

DETAILED DESCRIPTION

Figure 1A:
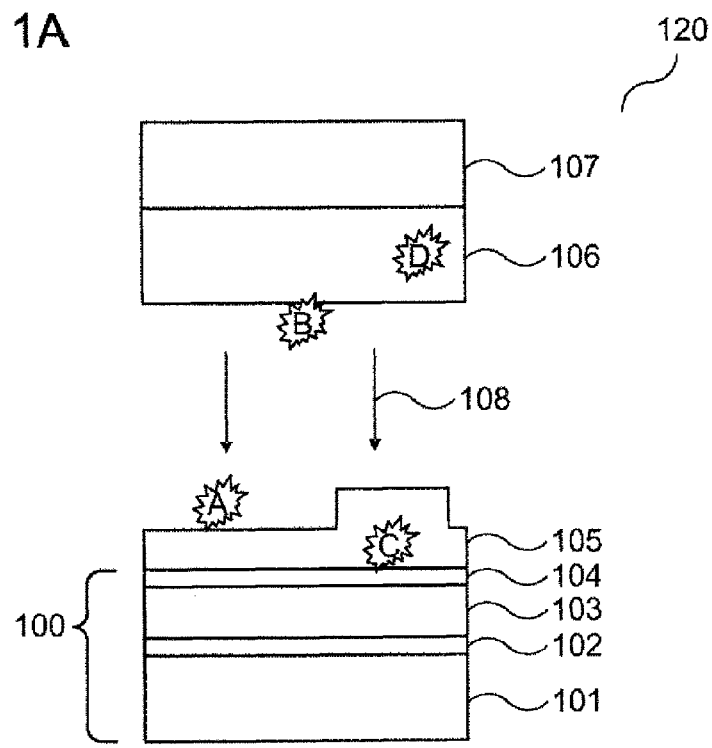
FIG. 1A shows an organic light emitting diode (OLED) including a barrier thin film and a scratch protective film with adhesive layer before a lamination process.

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling.

In the figures, identical or similar elements are provided with identical reference signs, insofar as this is expedient.

FIG. 2A shows an encapsulation structure 210 for an optoelectronic component in accordance with one embodiment.

In accordance with various configurations, the encapsulation structure 210 may include a barrier thin-film layer 205 for protecting an optoelectronic component against chemical impurities.

In accordance with various configurations, the encapsulation structure 210 may include a cover layer 207 applied above the barrier thin-film layer 205 and serving for protecting the barrier thin-film layer 205 against mechanical damage.

In accordance with various configurations, the encapsulation structure 210 may include an intermediate layer 209 applied on the barrier thin-film layer 205 between barrier thin-film layer 205 and cover layer 207.

In accordance with one configuration, the cover layer 207 can be applied (e.g. laminated) on the intermediate layer 209 by means of an adhesive layer 206, as shown in FIG. 2A.

In accordance with various configurations, the intermediate layer 209 may include a curable material designed such that when the non-cured intermediate layer 209 is applied to the barrier thin-film layer 205, particle impurities at the surface 205a of the barrier thin-film layer 205 are included by the intermediate layer 209 and the applied intermediate layer 209 has a substantially planar (upper) surface 209a, and that after the intermediate layer 209 has been cured, said intermediate layer has a hardness such that mechanical loads on the barrier thin-film layer 205 that are caused by particle impurities during the application of the cover layer 207 are reduced by means of the intermediate layer 209.

The barrier thin-film layer 205, the intermediate layer 209 and the cover layer 207 can furthermore be formed in accordance with one or a plurality of the configurations described herein.

FIG. 2B shows an encapsulation arrangement 220 in accordance with one embodiment.

In accordance with various configurations, the encapsulation arrangement 200 includes an optoelectronic component 200 and an encapsulation structure 210. The encapsulation structure 210 can be formed in accordance with one or a plurality of the configurations described herein.

The optoelectronic component 200 may include at least one functional layer 203. The at least one functional layer 203 can be formed as an individual layer or as a layer stack having a plurality of partial layers. The at least one functional layer can furthermore be formed in accordance with one or a plurality of the configurations described herein.

In accordance with various configurations, the encapsulation structure 210 is formed above the at least one functional layer 203.

In accordance with various configurations, the optoelectronic component 200 may include one or a plurality of additional layers above and/or below the at least one functional layer 203.

In accordance with various configurations, the optoelectronic component 200 includes a substrate 201, as shown in FIG. 2B. The substrate 201 can be formed in accordance with one or a plurality of the configurations described herein.

In accordance with various configurations, the optoelectronic component 200 furthermore includes a first electrode 202. In accordance with one configuration, the first electrode 202 can be formed between the substrate 201 and the at least one functional layer 203, as shown in FIG. 2B. The first electrode 202 can furthermore be formed in accordance with one or more of the configurations described herein.

In accordance with various configurations, the optoelectronic component 200 furthermore includes a second electrode 204. In accordance with one configuration, the second electrode 204 can be formed between the at least one functional layer 203 and the barrier layer 205 as shown in FIG. 2B. The second electrode 204 can furthermore be formed in accordance with one or a plurality of the configurations described herein.

The optoelectronic component 200 can be formed in accordance with one or a plurality of the configurations described herein, for example as an organic optoelectronic component such as e.g. as an OLED, for example as a top emitter or as a bottom emitter or as a transparent OLED, in accordance with one or a plurality of the configurations described herein.

FIG. 3 shows a flow chart 300 illustrating a method for encapsulating an optoelectronic component in accordance with one embodiment.

In 302, in accordance with various embodiments, a barrier thin-film layer can be applied on or above an optoelectronic component. The barrier thin-film layer can serve for protecting the optoelectronic component against chemical impurities. The barrier thin-film layer can be applied in accordance with one or a plurality of the configurations mentioned herein.

In 304, an intermediate layer can be applied on the barrier thin-film layer. The intermediate layer may include a curable material designed such that when the non-cured intermediate layer is applied to the barrier thin-film layer, particle impurities at the surface of the barrier thin-film layer are included by the intermediate layer and the applied intermediate layer has a substantially planar surface. By way of example, one of the materials described herein can be used as curable material. The intermediate layer, by virtue of properties such as interfacial tension, thickness and viscosity, can make possible a good inclusion of the particles and a planarizing cover of the surface. In accordance with various configurations, processes which avoid mechanical loading of the surface of the barrier thin-film layer or of the optoelectronic component can be used for applying the intermediate layer. Suitable processes for this purpose are spin coating or dip coating, for example.

In 306, the intermediate layer can be cured. Curing can be effected in accordance with one or a plurality of the configurations described herein. In accordance with various configurations, after curing the intermediate layer can be robust enough to absorb mechanical loading at the included particles. In accordance with various configurations, the optoelectronic component (e.g. an organic optoelectronic component such as e.g. an organic light emitting diode (OLED)) can be contact-resistant after the intermediate layer has been applied.

In 308, a cover layer can be applied above the cured intermediate layer. The application of the cover layer can be effected in accordance with one or a plurality of the configurations mentioned herein. The cover layer can serve for protecting the barrier thin-film layer against mechanical damage. The curable material of the intermediate layer can be designed such that, after the intermediate layer has been cured, said intermediate layer has a hardness such that mechanical loads of the barrier thin-film layer that are caused by the particle impurities during the application of the cover layer are reduced by means of the intermediate layer.

FIG. 4A to FIG. 4D show on the basis of schematically simplified side views of an optoelectronic component, for example of an organic light emitting diode (OLED), in a partial section, a method for encapsulating an optoelectronic component in accordance with one embodiment at different points in time of the method.

FIG. 4A shows in a first view 420 a schematically simplified side view of an optoelectronic component 400. In accordance with one configuration, the optoelectronic component 400 is embodied as an organic light emitting diode (OLED). Alternatively, the optoelectronic component can be embodied as a different optoelectronic component, for example as a different organic optoelectronic component such as e.g. as an organic solar cell or photovoltaic cell (OPV), as an organic phototransistor or the like.

The optoelectronic component 400 includes a substrate 401. The substrate 401 can be a transparent substrate 401 (for example in the case where the optoelectronic component 400 (e.g. the OLED) is embodied as a bottom emitting optoelectronic component or bottom emitter or as a combination of bottom emitter and top emitter). However, the substrate 401 can also be a non-transparent substrate 401 (for example in the case where the optoelectronic component 400 (e.g. the OLED) is embodied as a top emitting optoelectronic component or top emitter). By way of example, the substrate may include glass, quartz, sapphire, plastic foil(s), metal, metal foil(s), silicon wafers or some other suitable substrate material.

In accordance with one configuration, the substrate 401 can be a flexible substrate, for example a foil substrate such as e.g. a plastic foil or a metal foil. In accordance with one configuration, the substrate 401 can be a flexible steel substrate, e.g. a steel foil.

In accordance with another configuration, the substrate 401 can be a rigid substrate, for example a glass substrate or a silicon wafer.

A first electrode 402 (first electrical contact) is formed on the substrate 401, for example by means of deposition. The first electrode 402 can also be designated as bottom electrode or bottom contact.

In various embodiments, the first electrode 402 can be formed as transparent. By way of example, in the case where the optoelectronic component 400 is embodied as a bottom emitter (or as a combination of bottom emitter and top emitter), the first electrode 402 can be formed as transparent.

In accordance with various embodiments, the first electrode 402 can be formed as non-transparent. By way of example, in the case where the optoelectronic component 400 is embodied as a top emitter, the first electrode 402 can be formed as non-transparent. In this case, the first electrode 402 can be formed for example as a reflective electrode (reflective contact).

In various embodiments, the first electrode (bottom electrode) 402 can be an anode, for example, and can be formed from indium-doped tin oxide (ITO) for example.

At least one organic functional layer 403 for charge transport and for generating light, such as, for example, a fluorescent and/or a phosphorescent emitter layer, is applied on the first electrode 402. Only one individual functional layer 403 is shown in the view 420. In accordance with one configuration, a plurality of functional layers formed one on top of another, illustratively a functional layer stack, can be provided.

Examples of emitter materials which can be used in the optoelectronic component 400 (for example an OLED) in accordance with various configurations include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III)), green phosphorescent $Ir(ppy)_3$ (tris(2-phenylpyridine)iridium III), red phosphorescent Ru (dtb-bpy)$_3$*2(PF$_6$) (tris[4,4'-di-tert-butyl-(2,2')-bipyridine] ruthenium (III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 ((4-dicyanomethylene)-2-methyl-6-juloldiyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of wet-chemical methods such as spin coating, for example.

The emitter materials can be embedded in a matrix material in a suitable manner.

The emitter materials of the emitter layers of the optoelectronic component 400 can be selected for example such that the optoelectronic component 400 emits white light. The emitter layer may include a plurality of emitter materials that emit in different colors (for example blue and yellow or blue, green and red); alternatively, the emitter layer can also be constructed from a plurality of partial layers, such as a blue fluorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

By way of example, it is possible to provide further organic functional layers which serve for example to further improve the functionality and thus the efficiency of the optoelectronic component 400.

It should be pointed out that, in alternative embodiments, any suitable form of light emitting functional layers, for example organic functional layers, can be provided and the embodiments are not restricted to a specific type of functional layer(s).

A second electrode 404 (second electrical contact) is formed on the at least one functional layer 403. The second electrode 404 can also be designated as top electrode or as top contact.

In various embodiments, the second electrode 404 can be formed as transparent. By way of example, in the case where the optoelectronic component 400 is embodied as a top emitter (or as a combination of top emitter and bottom emitter), the second electrode 404 can be formed as transparent.

In various embodiments, the second electrode 404 can be formed as non-transparent. By way of example, in the case where the optoelectronic component 400 is embodied as a bottom emitter, the second electrode 404 can be formed as non-transparent. In this case, the second electrode 404 can be formed for example as a reflective electrode (reflective contact).

A barrier thin-film layer (also designated as barrier thin film) 405 is applied on the second electrode 404. The barrier thin-film layer 405 serves for protecting the optoelectronic component 400 against chemical impurities. In particular, the barrier thin-film layer 405 can be designed such that it prevents the ingress of harmful chemical constituents such as, for example, water and oxygen into the optoelectronic component 400.

In the embodiment shown, the barrier thin-film layer 405 is formed as an individual layer. In accordance with alternative configurations, the barrier thin-film layer may include a layer stack having a plurality of partial layers formed one on top of another.

The barrier thin-film layer 405 can be applied by means of a suitable application method, for example by means of a suitable deposition method. In other words, the barrier thin-film layer 405 (or the individual partial layers of the barrier thin-film layer 405 in the case of a layer stack) can be deposited on the second electrode 404.

In accordance with one configuration, the barrier thin-film layer 405 can be applied for example by means of an atomic layer deposition (ALD) method. Alternatively, other suitable deposition methods can be used.

The barrier thin-film layer 405 can be formed as a transparent layer (or as a transparent layer stack in accordance with a configuration in which the barrier thin-film layer includes a plurality of partial layers). By way of example, the barrier thin-film layer 405 can be formed as a transparent layer in the case where the optoelectronic component 400 is embodied as a top emitter (or as a combination of top emitter and bottom emitter).

FIG. 4A shows that during the application of the barrier thin-film layer 405 particle impurities can be embedded in or below the barrier thin-film layer 405 (represented by particles "C" in FIG. 4A). These particle impurities can be particles which deposited for example before or during the application of the barrier thin-film layer 405 at or on the surface of the underlying layer, i.e. at or on the surface 404a of the second electrode 404 in the embodiment shown.

On account of the particle impurities "C" at the surface 404a of the second electrical contact 404, the applied barrier thin-film layer 405 can locally have unevennesses at the locations of the surface 404a of the second electrode 404 where particles "C" are present. To put it another way, it is possible that after the barrier thin-film layer 405 has been applied, the barrier thin-film layer 405, on account of the particle impurities "C" included therein, does not have a planar (upper) surface 405a, but rather illustratively one or a plurality of steps, as is shown in FIG. 4A.

FIG. 4A furthermore shows that the surface 405a of the barrier thin-film layer 405 has particle impurities (represented by particles "A" in FIG. 4A). In other words, particles "A" have deposited at or on the surface 405a of the barrier thin-film layer 405. These particles "contaminate" the surface 405a of the barrier thin-film layer 405.

Illustratively, FIG. 4A shows an optoelectronic component 400 (e.g. an OLED) formed on a substrate 401 (for example by means of deposition) and having a top-side barrier thin-film layer 405 for encapsulating the optoelectronic component 400 against ingress of harmful chemical constituents such as e.g. water and oxygen. It is furthermore shown that after the barrier thin-film layer 405 has been applied, particle contaminations can be present both on the surface 405a of the barrier thin-film layer 405 (particles "A" in FIG. 4A) and embedded in or below the barrier thin-film layer 405 (particles "C" in FIG. 4A).

FIG. 4B illustrates the application of an over-forming intermediate layer 409 for particle inclusion and for planarization on the basis of a second side view 440.

The intermediate layer 409 is applied on the barrier thin-film layer 405 (more precisely, on the upper surface 405a of the barrier thin-film layer 405).

The intermediate layer 409 includes a curable material. The curable material can be for example a UV-curing material, in other words a material that cures or can be cured under the action of UV radiation. Alternatively, the curable material can be a thermally curing material, in other words a material that cures or can be cured by means of heat treatment (heating). Alternatively, the curable material can also be a self-curing material, in other words a material that cures automatically without external influence such as e.g. heat treatment or UV radiation.

In accordance with one configuration, the curable material of the intermediate layer 409 can be a transparent material, for example in the case where the optoelectronic component 400 is embodied as top emitter (or as a combination of top emitter and bottom emitter). Alternatively, the curable material of the intermediate layer 409 can be a non-transparent material.

In accordance with one configuration, the intermediate layer 409 may include for example a transparent UV-curing polyacrylic protective lacquer as curable material.

The intermediate layer 409 (e.g. the protective lacquer) is applied in a non-cured state.

In accordance with various configurations, the intermediate layer 409 can be applied to the barrier thin-film layer 405 by means of a contactless application method.

By way of example, one (or more) of the following methods can be used as the contactless application method: a spraying method, a spin coating method (to put it another way, a rotary coating method or spin-on method) a dip coating method, a slot die coating method, a doctor blading method.

The (contactless) processes or methods for applying the intermediate layer 409 avoid a mechanical loading of the surface 405a of the barrier thin-film layer 405 or of the optoelectronic component 400.

Applying the intermediate layer 409 by means of spin coating can be particularly suitable for including particles (particles "A") remaining on the surface 405a of the barrier thin-film layer 405 and for planarizing the surface, in other words for compensating for the unevennesses of the surface 405a and for forming an intermediate layer 409 having a planar surface 409a.

In accordance with one configuration, as intermediate layer 409 a polyacrylic protective lacquer can be applied by spin coating at a rotational frequency of, for example, 750 rpm (revolutions per minute) and for a duration of, for example, 60 seconds. In accordance with other configurations, other values can be chosen for the rotational frequency and/or the duration of the spin coating.

In accordance with one configuration, directly before the contactless application of the intermediate layer 409, a step of cleaning the surface 405a can take place in order to minimize the number of possible particle impurities.

In accordance with one configuration, directly before the intermediate layer 409 (e.g. the lacquer) is applied by spin coating, the plate (the rotary plate) can be blasted with an inert gas (for example nitrogen). This can serve, for example, to reduce the number of possible particle impurities on the surface 405a of the barrier thin-film layer 405.

The intermediate layer 409 or the material of the intermediate layer 409 (for example the protective lacquer), by virtue of properties such as, for example, interfacial tension, thickness and viscosity, makes possible a good inclusion of the particle impurities present at or on the surface 405a of the barrier thin-film layer 405a and furthermore a planarizing cover of the surface, as is illustrated in FIG. 4B.

FIG. 4B shows that the particle impurities (particles "A") deposited at or on the surface 405a of the barrier thin-film layer 405 are enclosed or included by the intermediate layer 409 after the latter has been applied. In particular, the particle impurities (particles "A") are completely covered by the intermediate layer 409 and illustratively do not project from the applied intermediate layer 409.

Furthermore, the applied intermediate layer 409 has a planar surface 409a. Illustratively, therefore, the unevennesses of the surface 405a of the barrier thin-film layer 405 caused by the particle impurities (particles "C") present in or below the barrier thin-film layer 405 can also be compensated for or leveled by the application of the intermediate layer 409.

After the intermediate layer 409 has been applied, the intermediate layer 409 is cured, for example by means of UV radiation (with the use of a UV-curing material for the intermediate layer 409 such as e.g. a UV-curing polyacrylic protective lacquer) or by means of heat treatment (heating) (with the use of a thermally curing material for the intermediate layer 409). With the use of a self-curing material for the intermediate layer 409, the latter can alternatively also cure automatically.

In accordance with various configurations, the curing of the intermediate layer 409 can take place temporally directly after the application of the intermediate layer 409. By way of example, in accordance with one configuration, with the use of a UV-curing material (e.g. a UV-curing protective lacquer, e.g. UV-curing polyacrylic protective lacquer) for the intermediate layer 409, directly after the application of the intermediate layer 409, the latter can be cured by means of irradiation with UV light.

After the curing of the intermediate layer 409 (e.g. the protective lacquer) the optoelectronic component 400 (e.g. OLED) is protected against normal contact.

Figure 4C:
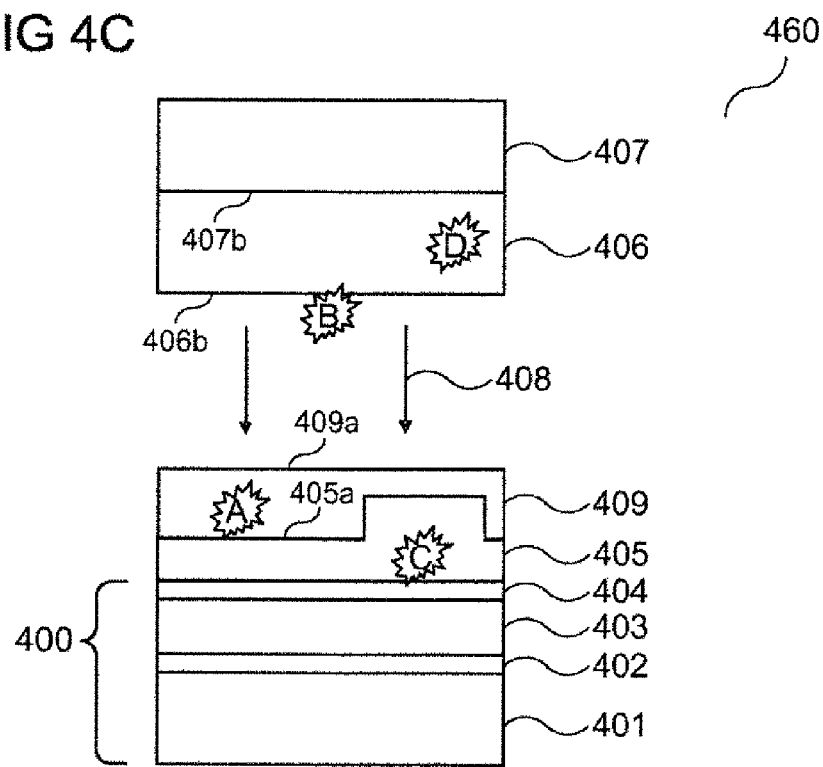

FIG. 4C shows the application of a cover layer 407 above the cured intermediate layer 409 on the basis of a third side view 460.

The cover layer 407 serves for protecting the barrier thin-film layer 409 against mechanical damage (e.g. scratching).

In accordance with one configuration, the cover layer 407 is formed as a rigid layer, e.g. as a glass layer. The cover layer 407 can also be designated as a cover plate.

In accordance with an alternative configuration, the cover layer 407 is formed as a flexible layer (e.g. as a foil).

The cover layer 407 can be formed as a transparent layer, alternatively as a non-transparent layer. By way of example, in a configuration in which the optoelectronic component 400 is embodied as a top emitter or as a combination of top emitter and bottom emitter, the cover layer 407 can be formed as a transparent layer.

The cover layer 407 can be laminated on the intermediate layer 409, for example, as shown in FIG. 4C. For this purpose, the cover layer 407 can be provided with an adhesive layer 406 (also designated as adhesive film) on its underside 407b, as is shown in FIG. 4C. The adhesive-bonding process or lamination process is symbolized by the arrows 408 in FIG. 4C.

In accordance with one configuration the cover layer 407 can be a self-adhesive (pressure-curing) protective foil, e.g. a polycarbonate foil (e.g. having a layer thickness of approximately 300 μm, alternatively having a different layer thickness) with an adhesive layer 406 (adhesive film ("pressure-sensitive adhesive")) (e.g. having a layer thickness of approximately 25 μm, alternatively having a different layer thickness).

In accordance with another configuration, the cover layer 407 can be a protective foil laminated with a thermally crosslinking adhesive film ("hot-melt"). Examples of such adhesive films are ethylene vinyl acetate (EVA) and thermoplastic elastomers on an olefin or urethane basis (e.g. EPDM (ethylene propylene diene monomer) elastomers).

FIG. 4C shows that particle impurities can be present both on the surface 406b (illustratively the underside) of the adhesive layer 406 facing the surface 409a of the intermediate layer 409 (particles "B") and embedded in the adhesive layer 406 (particles "D"). Illustratively, particle impurities can adhere to the underside 406b of the adhesive layer 406 (particles "B") and/or can be embedded in the adhesive layer 406.

The application of the cover layer 407 by means of the adhesive-bonding process or lamination process 408 takes place with pressure being exerted on the component parts to be connected. In the case of a conventional encapsulation method or a conventional encapsulation structure such as, for example, that shown in FIG. 1A and FIG. 1B, highly localized mechanical loads on the barrier thin-film layer (and possibly also deeper layers) can occur in this case as a result of the particle impurities and can lead to damage to the barrier thin-film layer (and possibly deeper layers). Particularly the damage to the barrier thin-film layer can have the effect that harmful chemical constituents such as water and oxygen can penetrate into the optoelectronic component and can damage the latter (cf. above).

By means of the intermediate layer 409 provided in accordance with various embodiments as described herein, mechanical loads occurring during the application of the cover layer 407 can be reduced to an extent such that damage to the barrier thin-film layer 405 (and underlying layers) is avoided.

In particular, in accordance with various configurations, the curable material of the intermediate layer 409 is designed such that the cured intermediate layer 409 has a hardness such that mechanical loads on the barrier thin-film layer 405 that are caused as a result of particle impurities during the application of the cover layer 407 are reduced by means of the intermediate layer 409.

By way of example, by means of the intermediate layer 409, it is possible to prevent particle impurities that are situated on or above the barrier thin-film layer 405 from being pressed into the barrier thin-film layer 405 and/or particle impurities that are already embedded in the barrier thin-film layer 405 from being pressed further into the barrier thin-film layer 405.

Figure 4D:
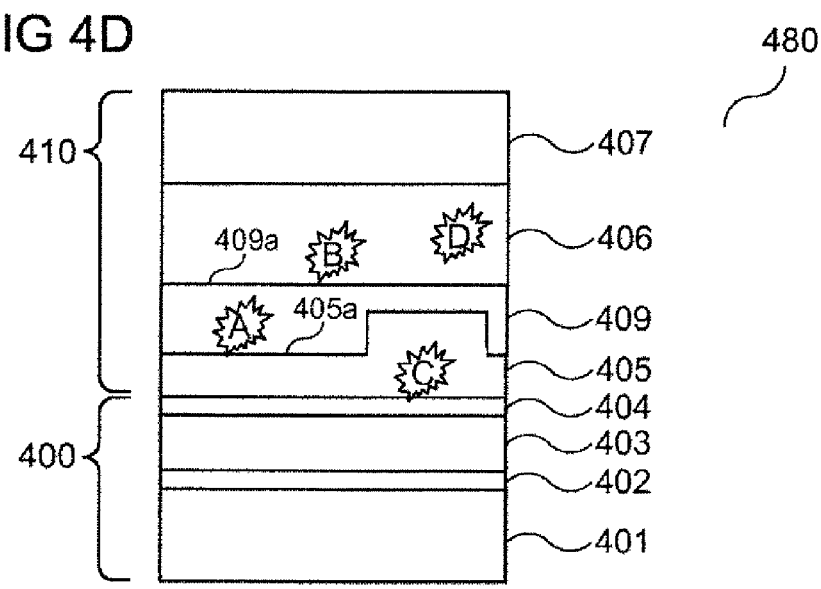

FIG. 4D shows, on the basis of a fourth side view 480, the optoelectronic component 400 including the top-side barrier thin-film layer 405 and the intermediate layer 409 applied thereto after the application of the cover layer 407.

FIG. 4D shows that the particle impurities (particles "A") included in the intermediate layer 409, during the application of the cover layer 407, are not pressed further into the intermediate layer 409 and in particular (in contrast to conventional methods such as that shown in FIG. 1A and FIG. 1B) are not pressed into the barrier thin-film layer 405. Illustratively, on account of its hardness and planar surface 409a the intermediate layer 409 can absorb the pressure exerted during the application of the cover layer 407 above the particles "A" and in this way prevent local pressure peaks that would lead to damage to the barrier thin-film layer 405 and possibly underlying layers from arising at the particles "A".

Furthermore, FIG. 4D shows that particle impurities (particles "B" in FIG. 4C) adhering to the underside 406b of the adhesive layer 406, during the application of the cover layer 407, are not pressed into the intermediate layer 409 and in particular (in contrast to conventional methods such as that shown in FIG. 1A and FIG. 1B) are not pressed into the underlying barrier thin-film layer 405. Instead, these particle impurities (particles "B") can be pressed into the adhesive layer 406, as is shown in FIG. 4D. Illustratively, the intermediate layer 409 (e.g. compared with the hardness of the adhesive layer 406) has a hardness such that the pressure exerted by the particles "B" on the surface 409a of the intermediate layer 409 does not suffice to press the particles "B" into the intermediate layer 409. Instead, the particles "B" are pressed into the, compared with the intermediate layer 409, softer adhesive layer 406.

Figure 1B:
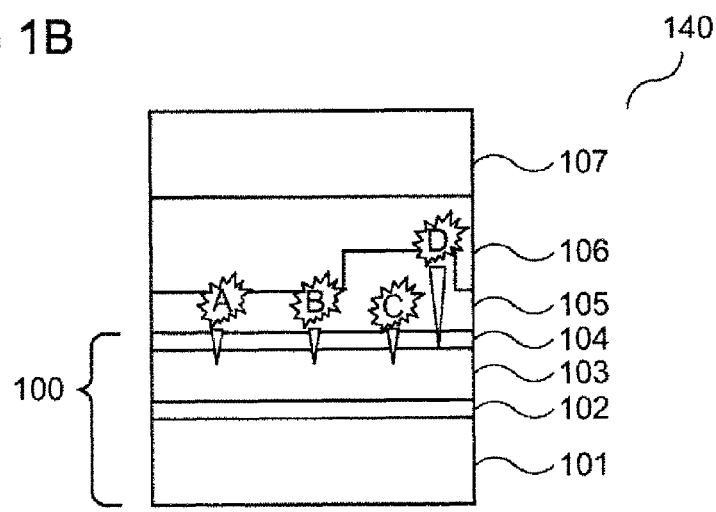
FIG. 1B shows the organic light emitting diode (OLED) shown in FIG. 1A after the lamination of the protective film with local damage in the barrier thin film.

Furthermore, FIG. 4D shows that particle impurities (particles "C") embedded in the barrier layer 405, during the application of the cover layer 407, are not pressed further into the barrier thin-film layer 405, in contrast to conventional methods such as that shown in FIG. 1A and FIG. 1B, where this is possible. Illustratively, on account of its hardness and planar surface 409a the intermediate layer 409 can absorb the pressure exerted during the application of the cover layer 407 above the particles "C" and in this way prevent local pressure peaks that would lead to damage to the barrier thin-film layer 405 and possibly underlying layers from arising at the particles "C".

Furthermore, FIG. 4D shows that particle impurities (particles "D") embedded in the adhesive layer 406, during the application of the cover layer 407, are not pressed into the intermediate layer 409 and (in contrast to conventional methods such as that shown in FIG. 1A and FIG. 1B) are in particular not pressed into the underlying barrier thin-film layer 405. Instead, these particle impurities (particles "D") can remain in the adhesive layer 406, as is shown in FIG. 4D.

The intermediate layer 409 therefore acts as protection of the barrier thin-film layer 405 against a high degree of local mechanical loading (illustratively high pressure) and damage as a result of particle impurities situated in a manner embedded in the barrier thin-film layer (particles "C") or above the barrier thin-film layer (particles "A", "B" and "D").

FIG. 4D illustratively shows an encapsulation arrangement in accordance with one embodiment which includes an optoelectronic component 400 having at least one functional layer 403 and an encapsulation structure 410 formed above the at least one functional layer.

The encapsulation structure 410 has a barrier thin-film layer 405 for protecting the optoelectronic component 400 against chemical impurities such as, for example, water and oxygen. A cover layer 407 is formed above the barrier thin-film layer 405 in order to protect the barrier thin-film layer 405 against mechanical damage (for example as a result of scratching). An intermediate layer 409 is formed on the barrier thin-film layer 405 between barrier thin-film layer 405 and cover layer 407. The intermediate layer 409 includes a curable material designed such that when the non-cured intermediate layer 409 is applied to the barrier thin-film layer 405, particle impurities at the surface 405a of the barrier thin-film layer 405 are included by the intermediate layer 409 and the applied intermediate layer 409 has a substantially planar surface 409a, and that after the intermediate layer 409 has been cured, said intermediate layer has a hardness such that mechanical loads on the barrier thin-film layer 405 that are caused as a result of particle impurities during the application of the cover layer 407 are reduced by means of the intermediate layer 409.

The barrier thin-film layer 405, the intermediate layer 409 and the cover layer 407 can in each case be embodied in accordance with one or a plurality of the configurations described herein.

The optoelectronic component 400 can be, for example, an organic optoelectronic component such as e.g. an OLED (alternatively, some other optoelectronic component). The at least one functional layer 403 can be an organic functional layer. In accordance with one configuration, the functional layer 403 can have a plurality of partial layers (layer stack). The optoelectronic component 400 can furthermore be configured in accordance with one or a plurality of the configurations described herein.

The optoelectronic component 400 may include a substrate 401, and the at least one functional layer 403 can be formed between a first (substrate-side) electrode 402 and a second (top-side) electrode 404, as shown. The substrate 401, the first electrode 402 and/or the second electrode 403 can be embodied in accordance with one or a plurality of the configurations described herein.

In accordance with various configurations, the substrate 401 of the optoelectronic component 400 and the cover layer 407 of the encapsulation structure 410 can in each case be rigid or flexible.

By way of example, in accordance with one configuration, the substrate 401 can be a rigid substrate (e.g. glass substrate) and the cover layer 407 can be a rigid cover plate (e.g. glass plate), for example in a manner similar to that in the case of a conventional glass-glass lamination. In accordance with another configuration, the substrate 401 can be a rigid substrate and the cover layer 407 can be a flexible cover foil. By way of example, a self-adhesive plastic protective foil can be applied in this case. In accordance with another configuration, the substrate 401 can be a flexible substrate and the cover layer 407 can be a rigid cover plate. In accordance with yet another configuration, the substrate 401 can be a flexible substrate 401 and the cover layer 407 can be a flexible cover foil. In this way, fully flexible or shapeable components can be realized, for example.

In accordance with various configurations, the substrate 401 and the cover layer 407 (cover plate) can in each case be transparent or non-transparent. In accordance with one configuration of the optoelectronic component 400 as a single-sided emitter, either the cover layer 407 is transparent (top emitter, i.e. single-sided emission through the top electrode (top contact)) or the substrate 401 (single-sided emission through the substrate 401). In accordance with another configuration, both the substrate 401 and the cover layer 407 can be transparent (transparent optoelectronic component such as e.g. transparent OLED component).

The construction of an encapsulation structure and process for encapsulating an optoelectronic component in accordance with various configurations, as described herein, are particularly suitable for example for encapsulating and protecting flexible organic optoelectronic components such as e.g. flexible OLEDs, since they make it possible to use commercial self-adhesive foils as the topmost protective layer (the cover layer).

By means of the encapsulation structure and the method for encapsulation in accordance with various embodiments, as described herein, the occurrence of lamination-governed defects during the encapsulation and packaging of an optoelectronic component (for example an organic optoelectronic component such as e.g. an OLED) can be reduced or prevented. It is thereby possible to increase for example the yield in the packaging of an optoelectronic component.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An encapsulation structure for an optoelectronic component, comprising:
    a barrier thin-film layer for protecting an optoelectronic component against chemical impurities;
    a cover layer applied above the barrier thin-film layer and serving for protecting the barrier thin-film layer against mechanical damage; and
    an intermediate layer applied on the barrier thin-film layer between barrier thin-film layer and cover layer and comprising a curable material designed such that when the non-cured intermediate layer is applied to the barrier thin-film layer, particle impurities at the surface of the barrier thin-film layer are enclosed by the intermediate layer and the applied intermediate layer has a substantially planar surface, and that after the intermediate layer has been cured, mechanical loads on the barrier thin-film layer as a result of particle impurities during the application of the cover layer are reduced by the intermediate layer.

2. The encapsulation structure as claimed in claim 1, wherein the curable material of the intermediate layer is formed as self-curing material, as thermally curing material, as UV-curing or as radiation-curing material.

3. The encapsulation structure as claimed in claim 1, wherein the curable material of the intermediate layer is formed as flexible curable material and/or as transparent curable material and/or as UV-resistant curable material.

4. The encapsulation structure as claimed in claim 1, wherein the curable material of the intermediate layer is a lacquer material.

5. The encapsulation structure as claimed in claim 1, wherein the curable material of the intermediate layer includes one or more of the following materials: a plastic, an epoxide, an acrylate, an imide, a carbonate, an olefin, a styrene, a urethane, a derivative of at least one of the materials in the form of monomers, oligomers or polymers, a mixture comprising at least two of the materials, or a copolymer or a compound comprising at least one of the materials.

6. The encapsulation structure as claimed in claim 1, wherein the hardness of the intermediate layer is more than 70.

7. The encapsulation structure as claimed in claim 1, wherein the layer thickness of the intermediate layer is approximately 100 nm to approximately 100 µm.

8. The encapsulation structure as claimed in claim 1, wherein the cover layer is laminated on the intermediate layer.

9. An encapsulation arrangement, comprising:
an optoelectronic component having at least one functional layer;
an encapsulation structure formed above the at least one functional layer, the encapsulation structure, comprising:
 a barrier thin-film layer for protecting an optoelectronic component against chemical impurities;
 a cover layer applied above the barrier thin-film layer and serving for protecting the barrier thin-film layer against mechanical damage; and
 an intermediate layer applied on the barrier thin-film layer between barrier thin-film layer and cover layer and comprising a curable material designed such that when the non-cured intermediate layer is applied to the barrier thin-film layer, particle impurities at the surface of the barrier thin-film layer are enclosed by the intermediate layer and the applied intermediate layer has a substantially planar surface, and that after the intermediate layer has been cured, mechanical loads on the barrier thin-film layer as a result of particle impurities during the application of the cover layer are reduced by the intermediate layer.

10. The encapsulation arrangement as claimed in claim 9, wherein the at least one functional layer is formed as an organic functional layer.

11. A method for encapsulating an optoelectronic component, the method comprising:
applying a barrier thin-film layer on or above an optoelectronic component for protecting the optoelectronic component against chemical impurities;
applying an intermediate layer on the barrier thin-film layer, wherein the intermediate layer comprises a curable material designed such that when the non-cured intermediate layer is applied to the barrier thin-film layer, particle impurities at the surface of the barrier thin-film layer are enclosed by the intermediate layer and the applied intermediate layer has a substantially planar surface;
curing the intermediate layer; and
applying a cover layer above the cured intermediate layer for protecting the barrier thin-film layer against mechanical damage,
wherein the curable material of the intermediate layer is designed such that after the intermediate layer has been cured, said intermediate layer has a hardness such that mechanical loads on the barrier thin-film layer that are caused as a result of particle impurities during the application of the cover layer are reduced by means of the intermediate layer.

12. The method as claimed in claim 11,
wherein the intermediate layer is cured by means of a thermal treatment, by means of UV radiation, by means of radiation or without external action.

13. The method as claimed in claim 11,
wherein the curable material of the intermediate layer comprises a lacquer material.

14. The method as claimed in claim 11,
wherein the curable material of the intermediate layer comprises one or more of the following materials: a plastic, an epoxide, an acrylate, an imide, a carbonate, an olefin, a styrene, a urethan, a derivative of at least one of the materials in the form of monomers, oligomers or polymers, a mixture comprising at least two of the materials, or a copolymer or a compound comprising at least one of the materials.

15. The method as claimed in claim 11,
wherein the intermediate layer is applied by means of a contactless application method.

16. The method as claimed in claim 15,
wherein the contactless application method comprises at least one of the following methods:
a spraying method;
a spin coating method;
a dip coating method;
a slot die coating method;
a doctor blading method.

17. The method as claimed in claim 11,
wherein applying the cover layer comprises laminating the cover layer onto the intermediate layer.

* * * * *